US 6,636,415 B2

United States Patent
Tang et al.

(10) Patent No.: US 6,636,415 B2
(45) Date of Patent: Oct. 21, 2003

(54) CAPACITOR CONSTRUCTIONS, METHODS OF FORMING BITLINES, AND METHODS OF FORMING CAPACITOR AND BITLINE STRUCTURES

(75) Inventors: Sanh D. Tang, Boise, ID (US); Raj Narasimhan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/198,401

(22) Filed: Jul. 17, 2002

(65) Prior Publication Data

US 2002/0176220 A1 Nov. 28, 2002

Related U.S. Application Data

(60) Continuation of application No. 09/853,664, filed on May 11, 2001, now Pat. No. 6,433,994, which is a division of application No. 09/518,512, filed on Mar. 3, 2000, now Pat. No. 6,335,237.

(51) Int. Cl.$^7$ ................... H01K 4/005; H01L 21/8242
(52) U.S. Cl. ................... 361/303; 361/311; 361/306.3; 438/238; 438/253
(58) Field of Search ................. 361/303, 306.3, 361/306.1, 311–313, 321.2, 321.3, 330; 257/306, 309–310, 303, 308; 438/240, 241, 253, 396, 639

(56) References Cited

U.S. PATENT DOCUMENTS

| 5,622,883 | A | 4/1997 | Kim |
| 5,792,687 | A | 8/1998 | Jeng et al. |
| 5,837,577 | A | 11/1998 | Cherng |
| 6,025,227 | A | 2/2000 | Sung |
| 6,033,966 | A | 3/2000 | Linliu |
| 6,051,462 | A | 4/2000 | Ohno |
| 6,235,630 | B1 | 5/2001 | Akram et al. |
| 6,333,535 | B2 | 12/2001 | Okumura |
| 6,433,994 | B2 * | 8/2002 | Tang et al. ................. 361/303 |

* cited by examiner

*Primary Examiner*—Anthony Dinkins
(74) *Attorney, Agent, or Firm*—Wells St. John P.S.

(57) ABSTRACT

The invention encompasses a method of forming bitlines. A substrate is provided, and comprises a plurality of spaced electrical nodes. A bitline layer is formed over at least some of the spaced electrical nodes. The bitline layer comprises at least one conductive material. Openings are etched through the bitline layer and to the electrical nodes. After the openings are formed, the bitline layer is patterned into bitlines. The invention also encompasses a method of forming a capacitor and bitline structure. A substrate is provided, and comprises a plurality of spaced electrical nodes. A stack of bitline materials is formed over at least some of the spaced electrical nodes. The bitline materials comprise at least one insulative material over at least one conductive material. Openings are etched through the bit line materials and to the electrical nodes. Conductive masses are formed in at least some of the openings. After the conductive masses are formed, the bitline materials are patterned into bitlines. Capacitor constructions are formed over the patterned bit lines and electrically connected to the electrical nodes through the conductive masses. Additionally, the invention encompasses capacitor constructions.

10 Claims, 9 Drawing Sheets

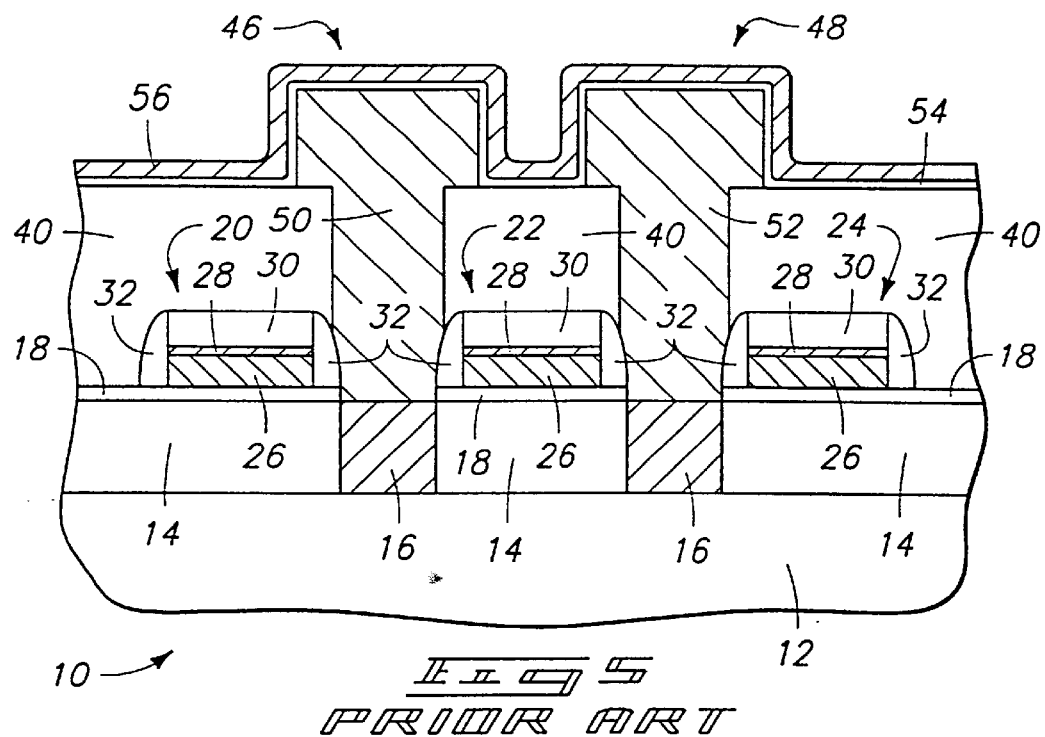
_FIG 5_
_PRIOR ART_
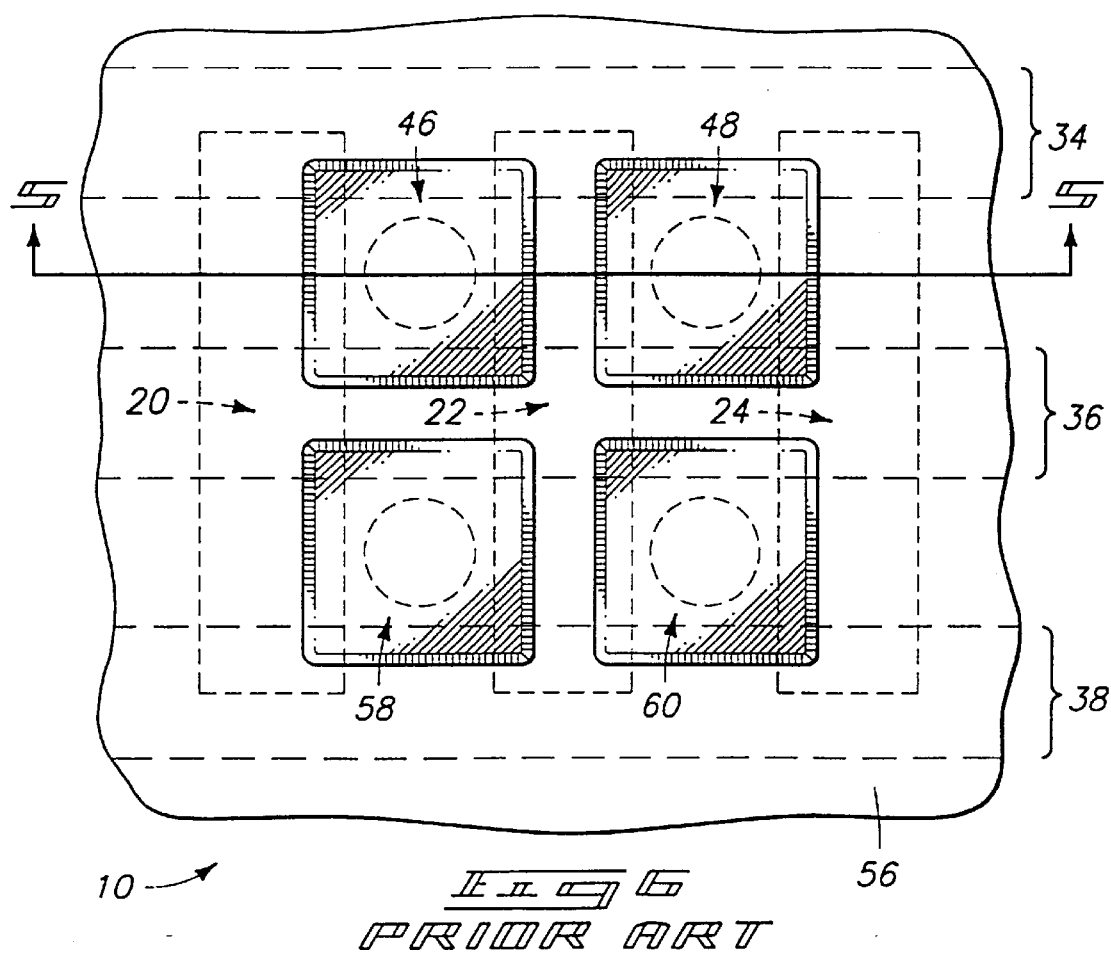
_FIG 6_
_PRIOR ART_

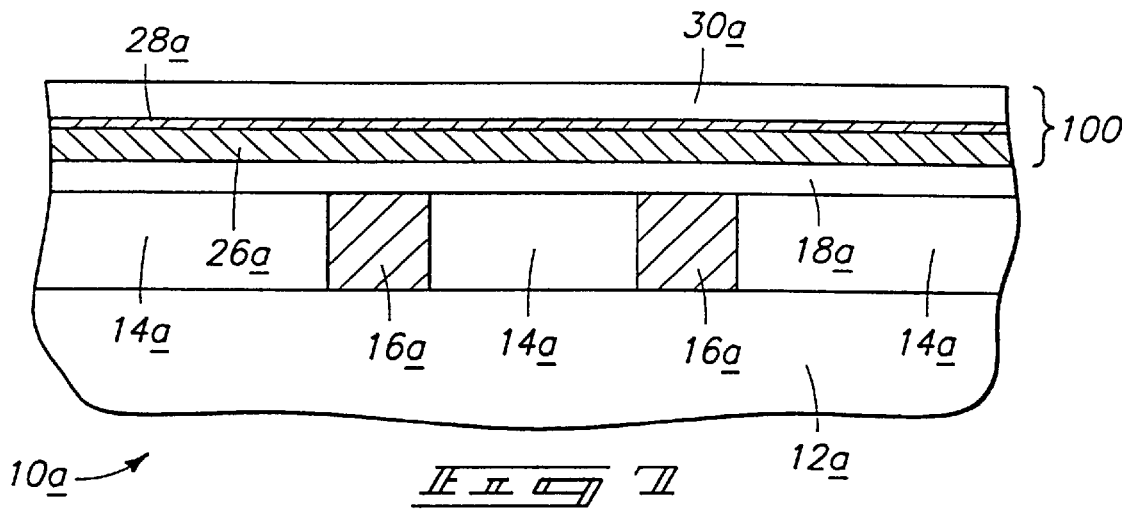
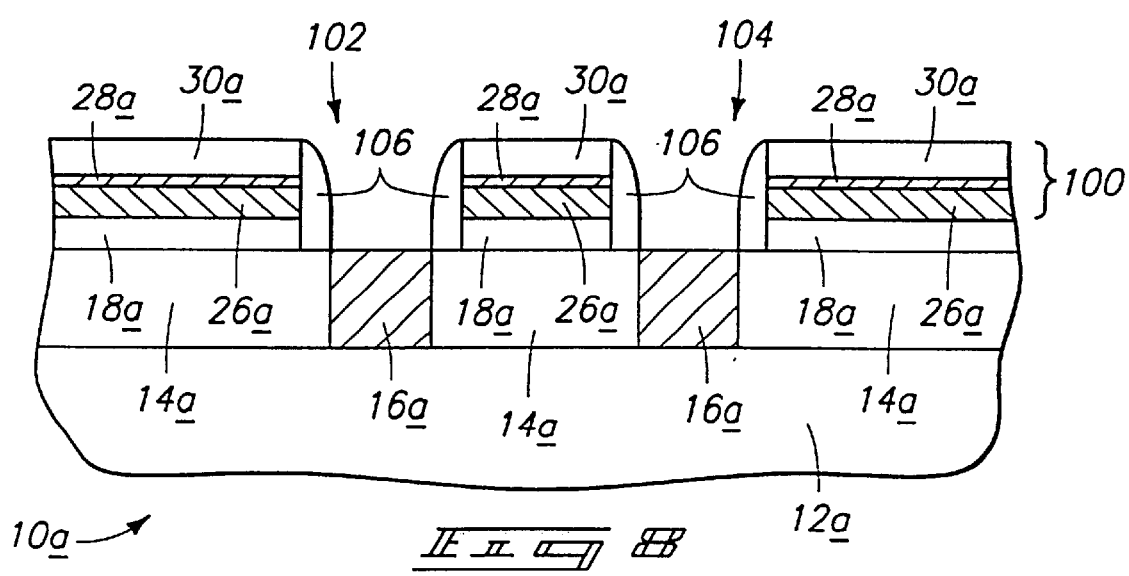

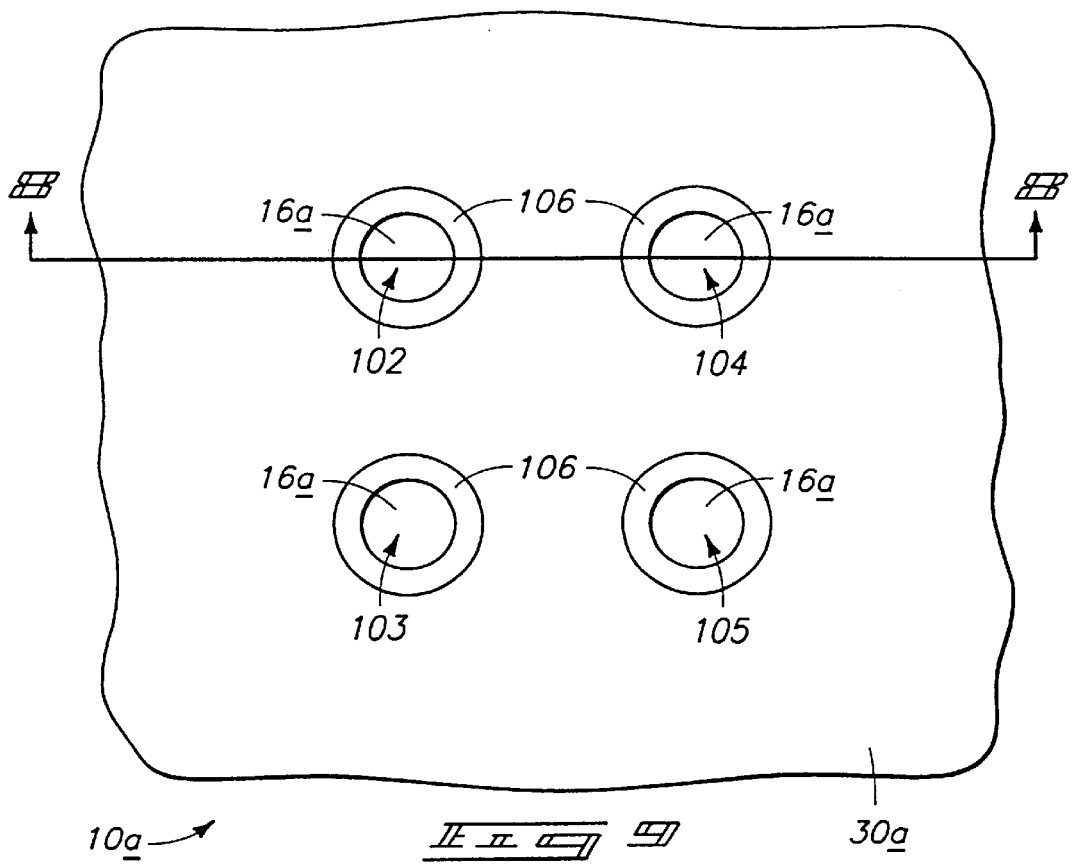
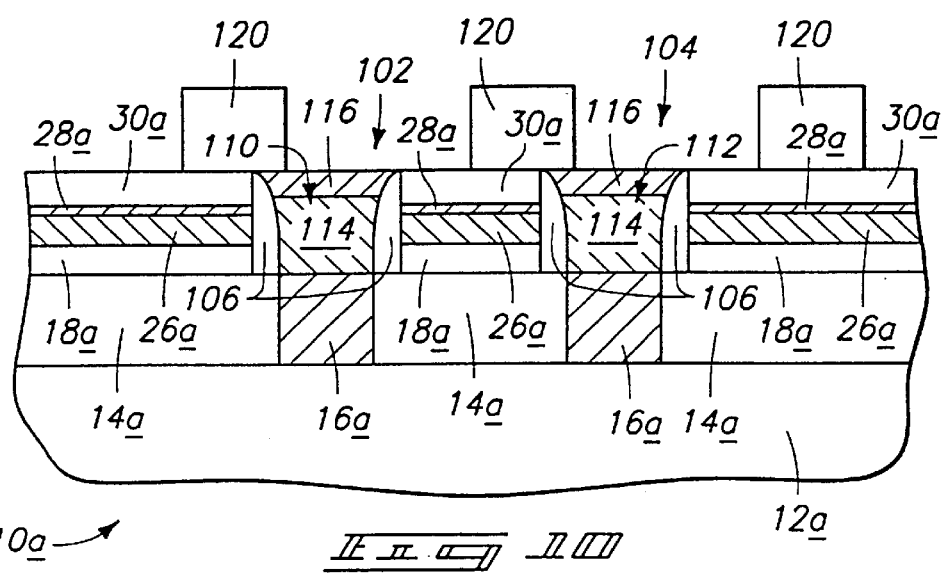

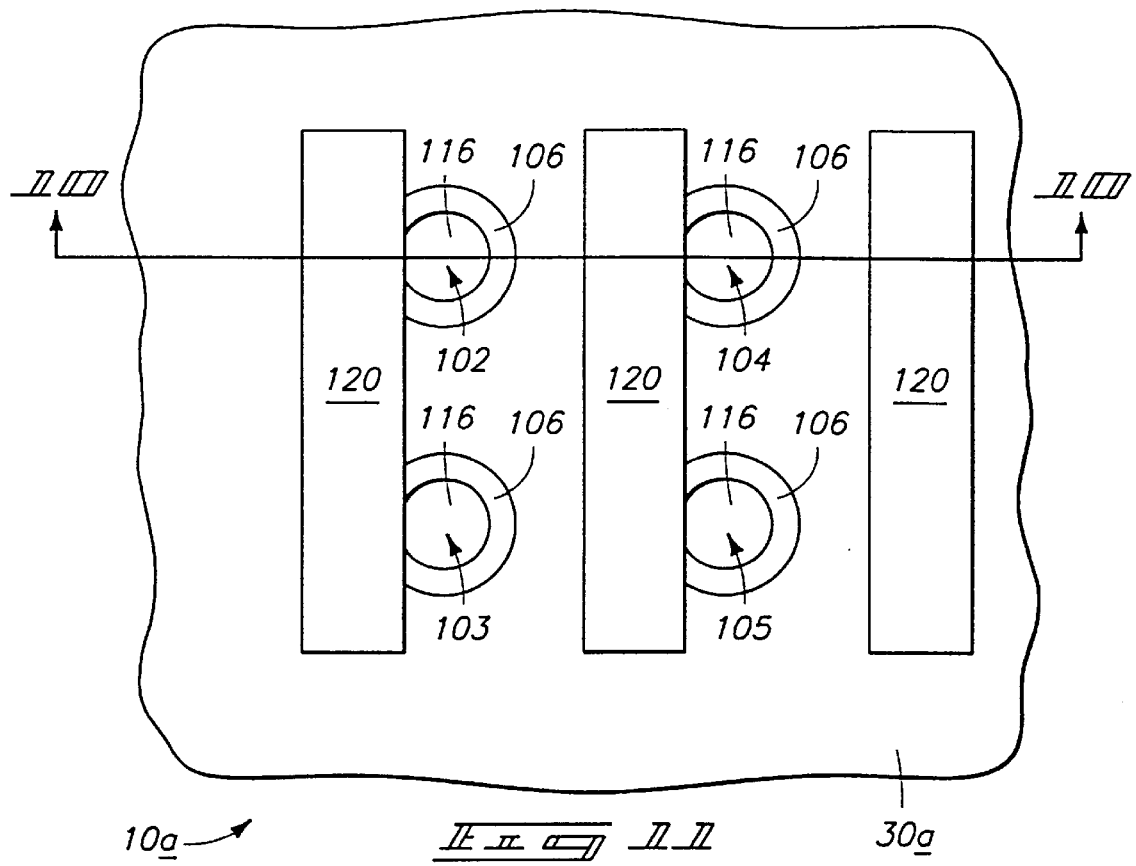
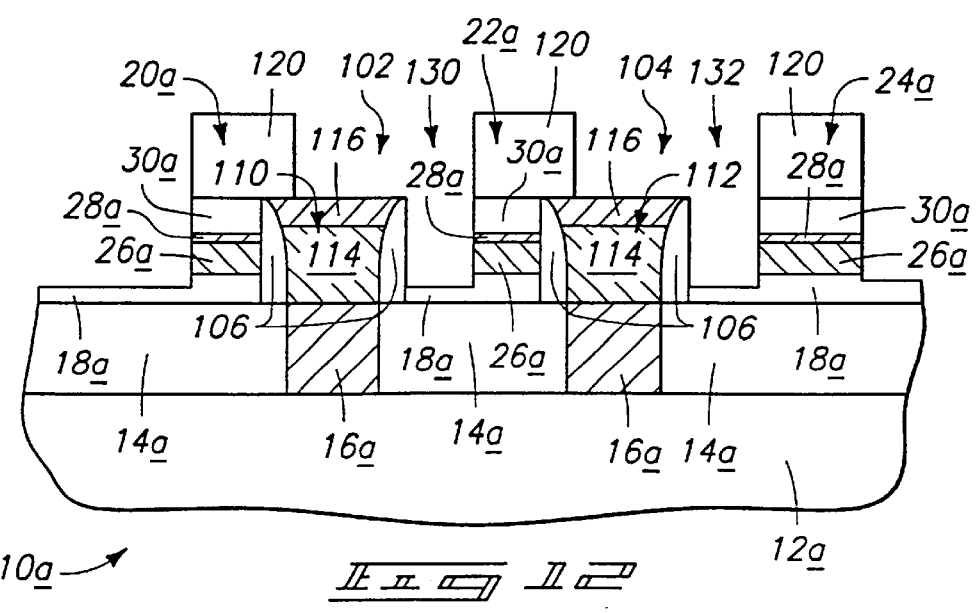

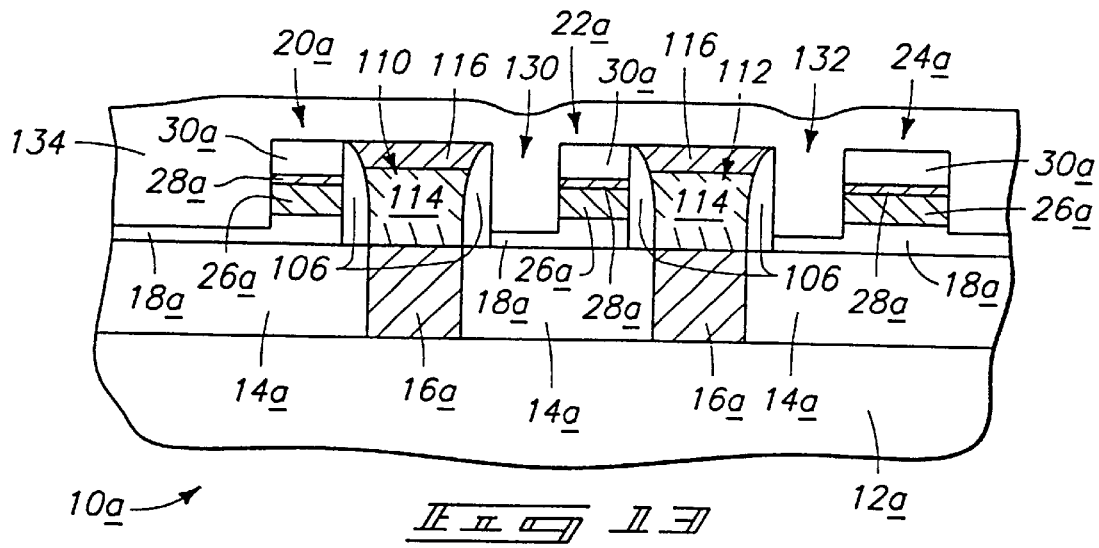
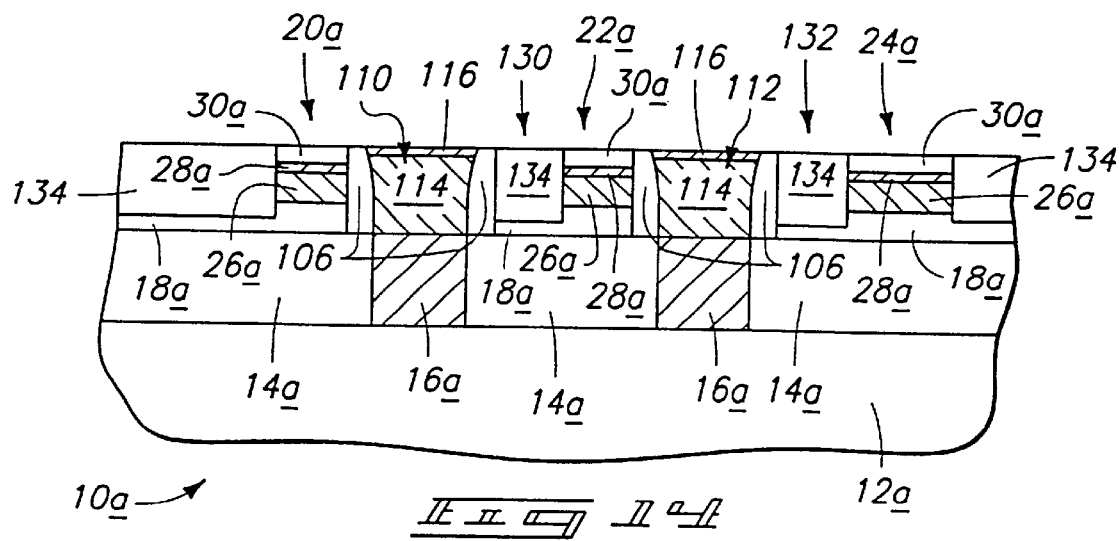

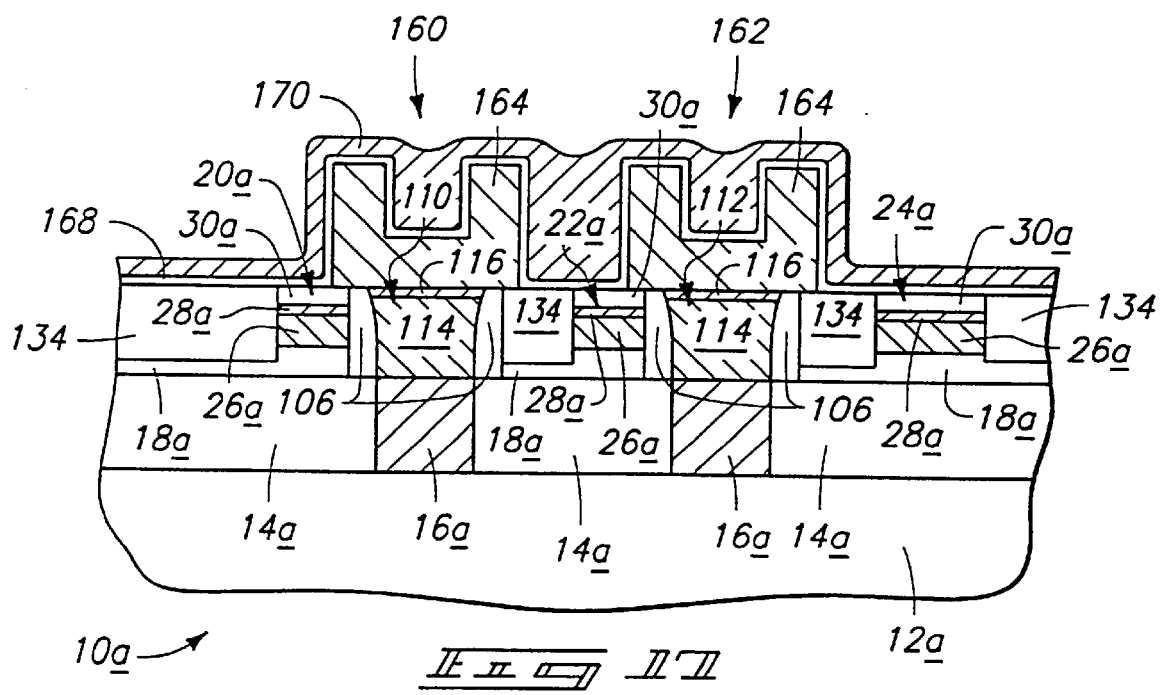

CAPACITOR CONSTRUCTIONS, METHODS OF FORMING BITLINES, AND METHODS OF FORMING CAPACITOR AND BITLINE STRUCTURES

This application is a continuation of U.S. patent application Ser. No. 09/853,664 now U.S. Pat. No. 6,433,994, filed on May 11, 2001, and which is incorporated herein by reference; which is a divisional application of U.S. patent application Ser. No. 09/518,512, filed Mar. 3, 2000 and now U.S. Pat. No. 6,335,237.

TECHNICAL FIELD

The invention pertains to capacitor constructions, methods of forming bitlines, and to methods of forming structures comprising both capacitors and bitlines.

BACKGROUND OF THE INVENTION

A typical semiconductor dynamic random access memory (DRAM) array will comprise wordlines, bitlines, and capacitor structures. A prior art method of forming a portion of a memory array is described with reference to FIGS. 1–6.

Referring initially to FIG. 1, a semiconductor wafer fragment 10 comprises a semiconductive material substrate 12 having a first insulative material 14 formed thereover. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Substrate 12 can, for example, comprise a monocrystalline silicon wafer having various circuitry elements (not shown) associated therewith. Insulative material 14 can comprise, for example, borophosphosilicate glass (BPSG).

Conductive plugs 16 are formed to extend through insulative material 14 and to substrate 12. Conductive plugs 16 can comprise any of a number of conductive materials, including, for example, metals and/or conductively doped polysilicon. Conductive plugs 16 can be electrically connected with conductive circuitry that is part of substrate 12, and which is not shown. Plugs 16 can be formed within insulative material 14 by, for example, etching openings in material 14, filling such openings with the conductive material, and subsequently removing any excess conductive material remaining over insulative material 14 by, for example, chemical-mechanical polishing.

A second insulative material 18 is formed over conductive plugs 16 and first insulative material 14. Second insulative material 18 can comprise, for example, silicon dioxide.

A plurality of patterned bitlines 20, 22 and 24 are formed over second insulative material 18. The patterned bitline constructions 20, 22 and 24 comprise a pair of conductive materials 26 and 28, and a third insulative material 30 overlying conductive materials 26 and 28. Conductive materials 26 and 28 can comprise, for example, conductively doped polysilicon and a metal-silicide, respectively. The metal-silicide can comprise, for example, titanium silicide or tungsten silicide. It is noted that although the shown bitlines comprise two conductive materials, the bitlines can also be formed to comprise only one conductive material, or more than two conductive materials. If the bitlines comprise only one conductive material, such conductive material can be either conductively doped polysilicon or a metal silicide. The insulative material 30 of bitline constructions 20, 22 and 24 can comprise one or more insulative layers. Individual layers can comprise, for example, silicon dioxide.

A plurality of insulative spacers 32 are formed along sidewalls of bitline constructions 20, 22 and 24. Insulative spacers 32 can comprise, for example, silicon nitride.

FIG. 2 shows a top view of fragment 10 at the processing step of FIG. 1, and shows bitline constructions 20, 22 and 24 extending as lines across an upper surface of second insulative material 18. FIG. 2 also shows wordline locations 34, 36 and 38 (indicated by dashed lines) extending across fragment 10 perpendicularly relative to bitline structures 20, 22 and 24. Wordlines can be formed in locations 34, 36 and 38 to extend either above or below bitline structures 20, 22 and 24, and accordingly can be formed either before or after the patterning described with reference to FIG. 1.

Referring next to FIG. 3, wafer fragment 10 is shown in a view corresponding to that of FIG. 1, and at a processing step subsequent to FIG. 1. Specifically, a fourth insulative material 40 has been formed over bitline constructions 20, 22 and 24, and a patterned masking layer 42 has been formed over fourth insulative material 40. Fourth insulative material 40 can comprise, for example, a silicon oxide such as, for example, silicon dioxide or BPSG, and patterned masking layer 42 can comprise, for example, photoresist.

Patterned masking layer 42 has openings 44 extending therein and such openings are transferred through insulative materials 40 and 18 with a suitable etch to extend the openings to conductive plugs 16. Preferably, the etch utilized to extend openings 44 through insulative materials 40 and 18 is an etch selective for materials 40 and 18 relative to spacers 32. However, a difficulty with the etch can be that the etch is not 100% selective for the silicon oxide materials relative to the silicon nitride material, and accordingly if the etch is conducted too long it can etch through the silicon nitride spacers to expose conductive materials 26 and 28. The shown embodiment of FIG. 3 is an idealized etch wherein only insulative materials 18 and 40 have been etched, and wherein spacers 32 have not been etched. It is to be understood that such idealized etch rarely, if ever occurs, and accordingly there is typically at least some etching of insulative spacers 32 during the etch of materials 18 and 40.

FIG. 4 shows a top view of wafer fragment 10 at the processing step of FIG. 3, and shows that openings 44 are preferably formed at locations between bitlines 20, 22 and 24 (shown in phantom), as well as between wordline locations 34, 36 and 38. The processing of FIG. 4 is shown as idealized processing wherein the openings 44 are aligned to be between bitlines 20, 22 and 24. It is noted that occasionally mask misalignment occurs, and openings 44 are accordingly shifted to extend into one or more of bitline constructions 20, 22 and 24. Such shift can result in exposure of conductive materials 28 and/or 26 during the etch utilized to form openings 44. Such exposure of conductive materials 28 and/or 26 can ultimately result in device failure.

FIG. 5 shows wafer fragment 10 at a processing step subsequent to that of FIG. 3, and in a view corresponding to that of FIG. 3. Capacitor constructions 46 and 48 are formed between and over bitline constructions 20, 22 and 24, and in electrical connection with conductive plugs 16. Capacitor constructions 46 and 48 comprise conductive storage nodes 50 and 52, respectively. Conductive storage nodes 50 and 52 can be formed of, for example, metal and/or conductively doped polysilicon. Capacitor constructions 46 and 48 further comprise a dielectric layer 54 and a conductive capacitor plate 56. Dielectric layer 54 can comprise, for example, silicon dioxide, silicon nitride, tantalum pentoxide, and/or other insulative materials known to persons of skill in the art. Conductive capacitor plate 56 can comprise, for example, metal and/or conductively doped polysilicon.

FIG. 6 shows a top view of wafer fragment 10 at the processing step of FIG. 5, and shows additional capacitor constructions 58 and 60 associated with wafer fragment 10. Constructions 58 and 60 can be similar to constructions 46 and 48 in comprising storage nodes (not shown), dielectric layer 54, and conductive capacitor plate 56. In the shown embodiment, capacitor constructions 46, 48, 58 and 60 extend over wordline locations 34, 36 and 38, as well as over bitlines 20, 22 and 24. Capacitor constructions 46, 48, 58 and 60 are typically electrically connected to transistor gates associated with wordlines 34, 36 and 38, as well as to bitlines 20, 22 and 24. More specifically, each of capacitors 46, 48, 58 and 60 is typically constructed to be selectively addressable by a particular combination of a wordline and a bitline to form an addressable storage unit of a memory device.

The prior art processing of FIGS. 1–6 has problems associated therewith which were discussed with relation to FIGS. 3 and 4. Specifically, mask misalignment at the processing of FIGS. 3 and 4 can expose conductive materials of the bitlines which can ultimately cause a short of the bitlines to capacitor constructions formed adjacent the bitlines, and result in device failure. Further, non-selectivity of the etch utilized to form the openings 44 shown in FIGS. 3 and 4 can result in exposure of conductive materials of the bitlines, and also ultimately lead to shorting of the bitlines to capacitor constructions formed adjacent them, and device failure. The problems become increasingly severe with decreasing bitline spacing due to thinner nitride spacers and tighter mask alignment tolerances. Accordingly, it would be desirable to develop new methods for forming capacitor structures and bitline constructions which avoided the problems.

SUMMARY OF THE INVENTION

In one aspect, the invention encompasses a method of forming bitlines. A substrate is provided, and comprises a plurality of spaced electrical nodes. A bitline layer is formed over at least some of the spaced electrical nodes. The bitline layer comprises at least one conductive material. Openings are etched through the bitline layer and to the electrical nodes. After the openings are formed, the bitline layer is patterned into bitlines.

In another aspect, the invention encompasses a method of forming a capacitor and bitline structure. A substrate is provided, and comprises a plurality of spaced electrical nodes. A stack of bitline materials is formed over at least some of the spaced electrical nodes. The bitline materials comprise at least one insulative material over at least one conductive material. Openings are etched through the bit line materials and to the electrical nodes. Conductive masses are formed in at least some of the openings. After the conductive masses are formed, the bitline materials are patterned into bitlines. Capacitor constructions are formed over the patterned bit lines and electrically connected to the electrical nodes through the conductive masses.

The invention also encompasses capacitor constructions.

BRIEF DESCRIPTION OF THE DRAWINGS

Preferred embodiments of the invention are described below with reference to the following accompanying drawings.

FIG. 5 is a diagrammatic, cross-sectional view of the FIG. 1 wafer fragment shown at a processing step subsequent to that of FIG. 3.

FIG. 6 is a top view of the FIG. 5 wafer fragment.

FIG. 7 is a diagrammatic, cross-sectional view of a wafer fragment at an initial processing step of a method of the present invention.

FIG. 8 is a view of the FIG. 7 wafer fragment shown at a processing step subsequent to that of FIG. 7.

FIG. 9 is a top view of the FIG. 8 wafer fragment.

FIG. 10 is a cross-sectional view of the FIG. 7 wafer fragment shown at a processing step subsequent to that of FIG. 8.

FIG. 11 is a top view of the FIG. 10 wafer fragment.

FIG. 12 is a cross-sectional view of the FIG. 7 wafer fragment shown at a processing step subsequent to that of FIG. 10.

FIG. 13 is a cross-sectional view of the FIG. 7 wafer fragment shown at a processing step subsequent to that of FIG. 12.

FIG. 14 is a cross-sectional view of the FIG. 7 wafer fragment shown at a processing step subsequent to that of FIG. 13.

FIG. 17 is a cross-sectional view of the FIG. 7 wafer fragment shown at a processing step subsequent to that of FIG. 14, and in accordance with a second embodiment of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
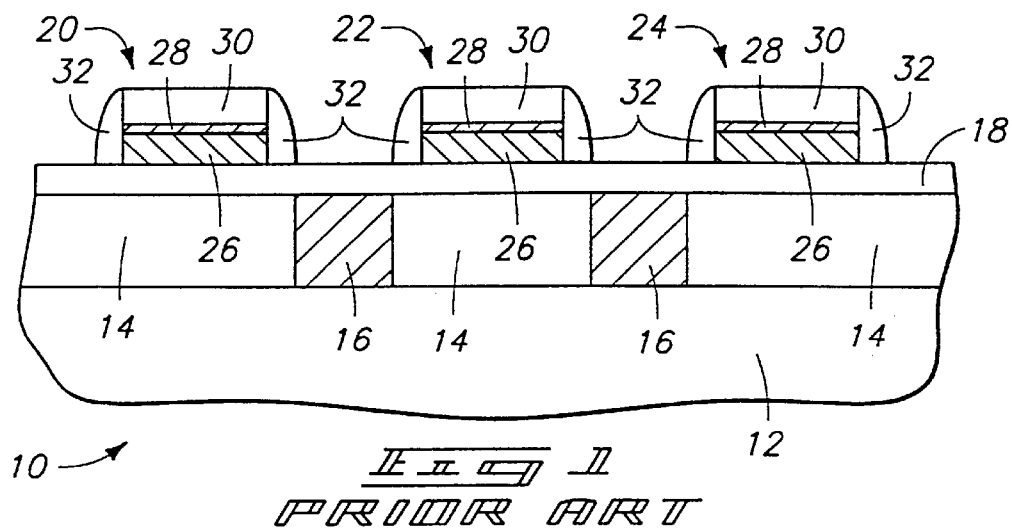
FIG. 1 is a diagrammatic, cross-sectional view of a semiconductor wafer fragment at an initial prior art processing step.
Figure 2:
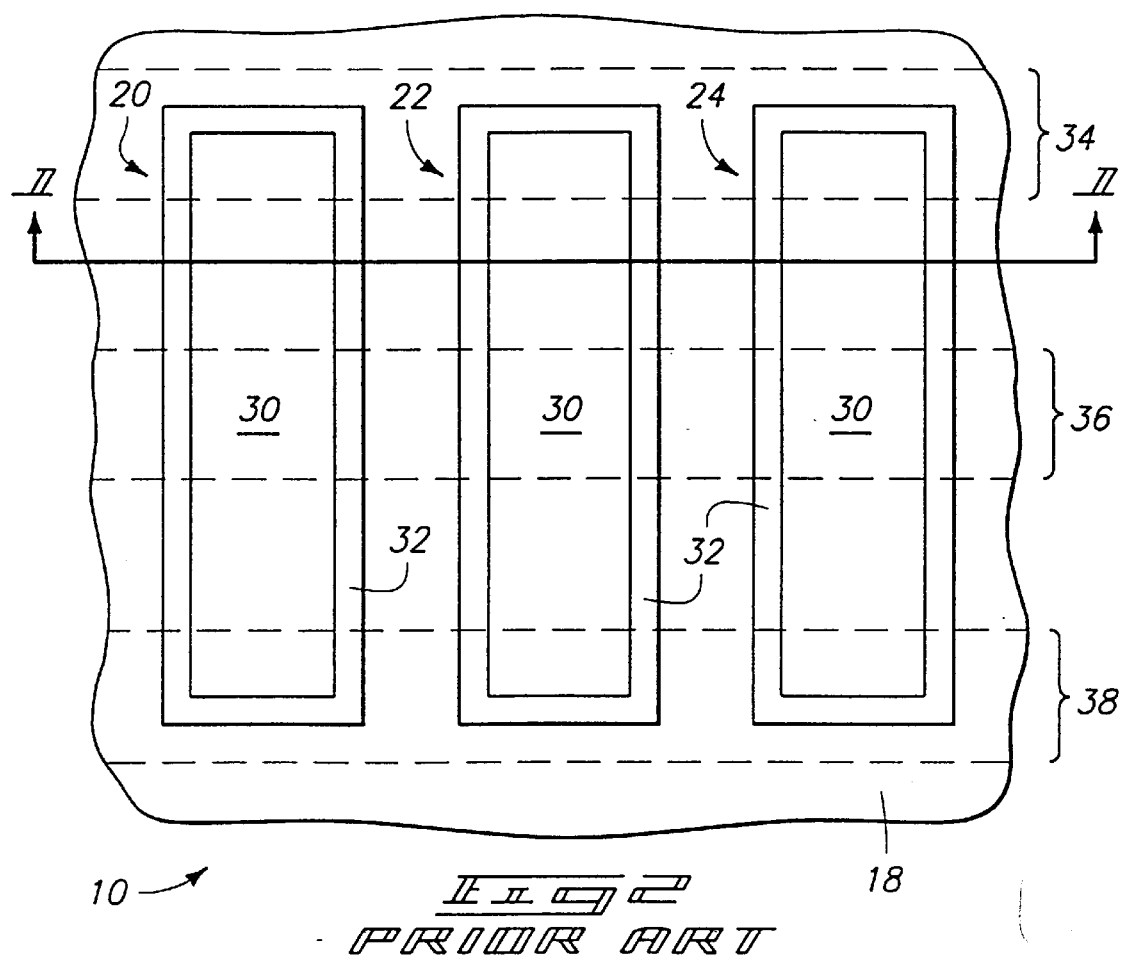
FIG. 2 is a top view of the FIG. 1 wafer fragment.
Figure 3:
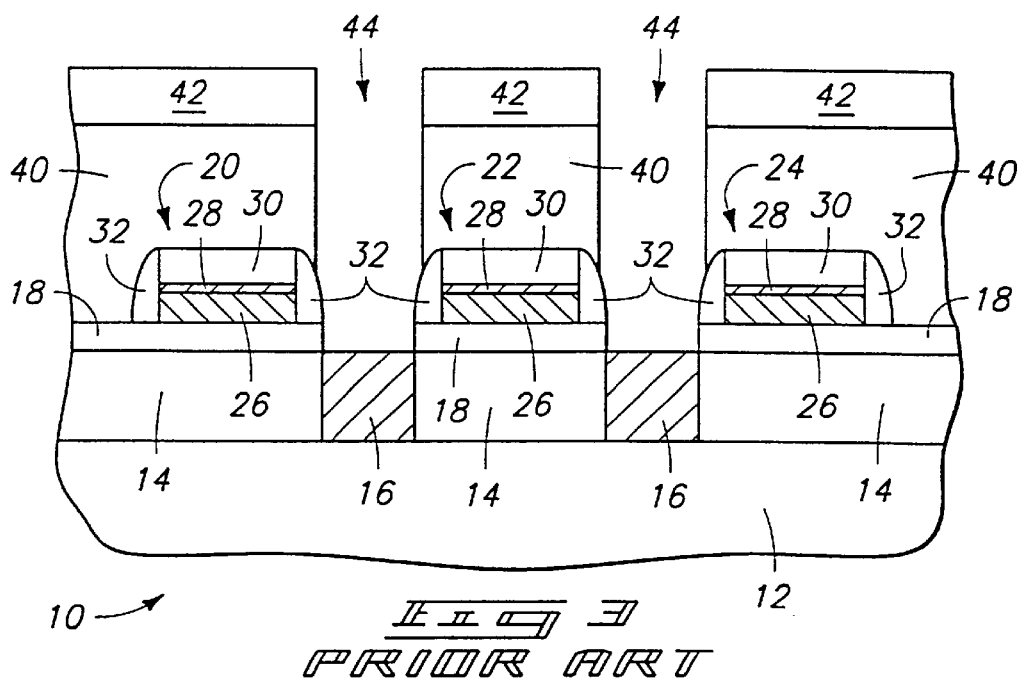
FIG. 3 is a diagrammatic, cross-sectional view of the FIG. 1 wafer fragment at a prior art processing step subsequent to that of FIG. 1.
Figure 4:
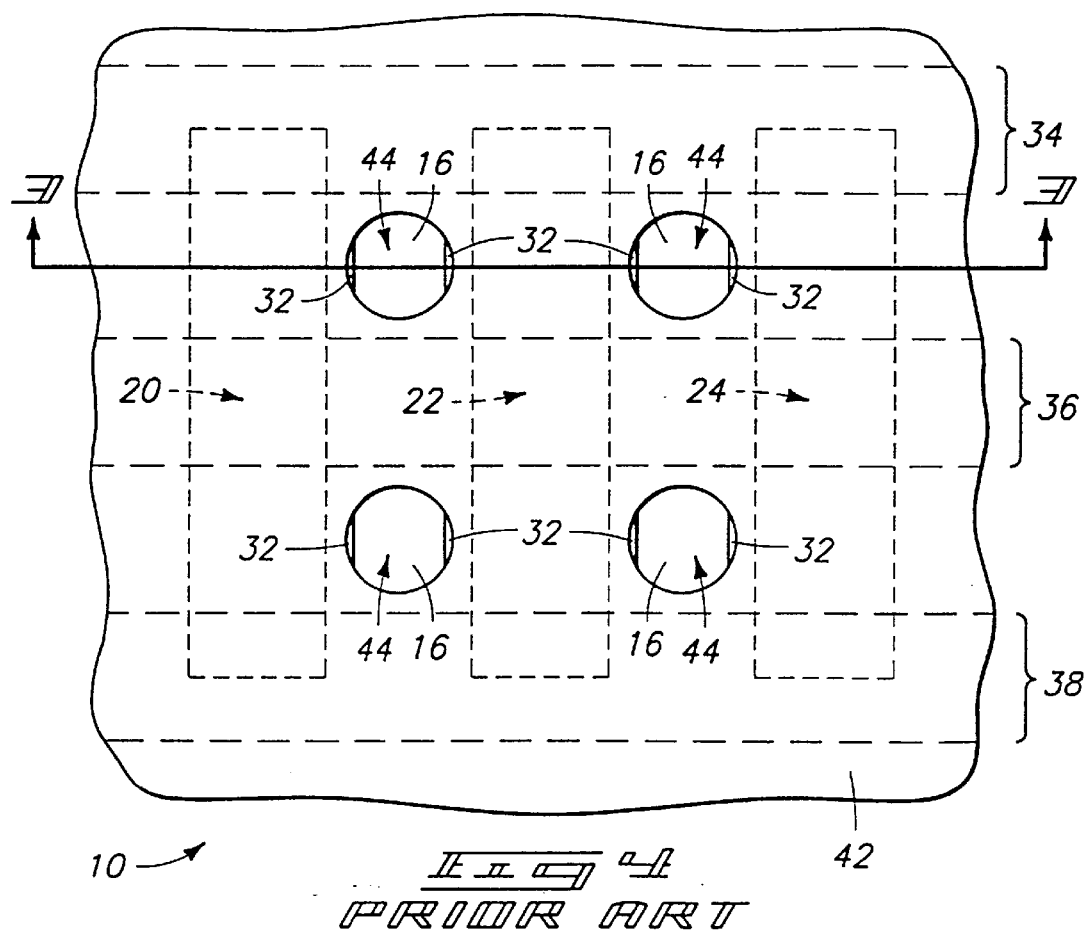
FIG. 4 is a top view of the FIG. 3 wafer fragment.

The prior art methodology described above with reference to FIG. 1–6 comprised patterning bitline structures (structures 20, 22 and 24 of FIGS. 1–6) prior to forming openings between the structures (openings 44 in FIGS. 3 and 4) for ultimate formation of capacitor constructions (capacitor constructions 46 and 48 of FIG. 5) between the structures. One aspect of the present invention is a recognition that the prior art problems discussed above in the "Background" section of this disclosure can be avoided by forming openings through bitline materials prior to patterning the materials into bitline structures. Such aspect is described with reference to FIGS. 7–17. In referring to FIGS. 7–17, similar numbering will be utilized as was used above in describing the prior art processing of FIGS. 1–6, with the suffix "a" used to indicate structures of FIGS. 7–17.

Referring first to FIG. 7, a semiconductor wafer fragment 10a is shown at an initial processing step of a method of the present invention. Fragment 10a comprises a substrate 12a having an insulative material 14a formed thereover. Fragment 10a further comprises conductive plugs 16a extending through insulative material 14a. Plugs 16a define spaced electrical nodes. It is noted that although fragment 10a has been described as comprising electrical nodes 16a over a substrate 12a, an alternative description is to define structures 12a, 14a and 16a as a "substrate", and accordingly structures 16a can be considered as spaced electrical nodes within a substrate. An insulative material 18a is formed over spaced electrical nodes 16a and insulative material 14a. Structures 12a, 14a, 16a and 18a can comprise the same materials as described in the "Background" section of this disclosure for structures 12, 14, 16 and 18, respectively. Also, structure 14a can be considered as comprising a first insulative material, and structure 18a can be considered as comprising a second insulative material. Further, the "substrate" can be defined to comprise structure 18a in addition to structures 12a, 14a and 16a.

A stack 100 is formed over second insulative material 18a, and is defined to comprise bitline materials. Stack 100 can comprise, for example, at least one insulative material over at least one conductive material. In the shown embodiment, stack 100 comprises an insulative material 30a over conductive materials 26a and 28a. Materials 26a, 28a and 30a can comprise, for example, the same materials as discussed in the "Background" section of this disclosure for structures 26, 28 and 30. Accordingly, materials 26a and 28a can comprise conductively doped polysilicon and a metal silicide, respectively, and material 30a can comprise a silicon oxide, such as, for example, silicon dioxide or BPSG.

It is noted that although two conductive materials (26a and 28a) are shown within bitline stack 100, the invention encompasses other embodiments wherein only one conductive material is formed within the bitline stack. One way of describing the bitline stacks of the present invention which encompasses embodiments wherein only one conductive material is included within the stacks, as well as embodiments wherein multiple conductive materials are within the stacks, is to describe the conductive component of bitline stack 100 as comprising at least one of a metal-silicide-containing layer and a conductively-doped-polysilicon-containing layer. A more specific way of describing particular conductive materials which can be utilized in bitline stack 100 is to describe the conductive materials as comprising at least one of tungsten silicide, titanium silicide and conductively-doped polysilicon.

Referring to FIG. 8, openings 102 and 104 are etched through layers 18a, 26a, 28a and 30a, and to electrical nodes 16a. Openings 102 and 104 can be formed utilizing, for example, photolithographic processing with photoresist (not shown) as a masking layer.

After formation of openings 102 and 104, insulative spacers 106 are provided within the openings to narrow the openings and provide isolation between subsequently formed conductive masses 114 (described below with reference to FIG. 10) and conductive bit line material 26a. Insulative spacers 106 can comprise, for example, silicon nitride (such as, for example, $Si_3N_4$), or silicon dioxide. Spacers 106 can be formed by, for example, chemical vapor deposition of a layer of silicon nitride or silicon dioxide, followed by anisotropic etching of such layer.

A top view of wafer fragment 10a at the processing step of FIG. 8 is shown in FIG. 9. The fragment 10a of FIG. 9 comprises openings 103 and 105, in addition to the openings 102 and 104. The view of FIG. 9 also shows that spacers 106 are along sidewall peripheries of openings 102, 104, 103 and 105. FIGS. 8 and 9 show that openings 102, 104, 103 and 105 are entirely surrounded by the layers 26a, 28a and 30a of stack 100.

FIG. 10 shows wafer fragment 10a at a processing step subsequent to that of FIG. 8, and shows conductive masses 110 and 112 formed within openings 102 and 104, respectively. Masses 110 and 112 comprise an inner conductive layer 114 and an outer conductive layer 116. Inner conductive layer 114 can comprise, for example, conductively doped polysilicon and outer conductive layer 116 can comprise, for example, cobalt silicide ($CoSi_x$). Alternatively, conductive masses can be comprised of entirely one conductive material, such as, for example, cobalt silicide. Further, conductive masses can consist essentially of one or both of conductively doped polysilicon and cobalt silicide, or consist of one or both of cobalt silicide and conductively doped polysilicon. Preferably, an outermost portion of conductive masses 110 and 112 will comprise a material against which conductive materials 26a and 28a can be selectively etched for reasons which will become apparent in the discussion below. Cobalt silicide is accordingly a preferred material for an outer portion of masses 110 and 112 because cobalt silicide can be selectively etched relative to a number of conductive materials commonly utilized in bitline constructions such as, for example, conductively doped polysilicon, tungsten silicide, and titanium silicide.

Conductive masses 110 and 112 can be formed by, for example, providing suitable conductive materials over wafer fragment 10a and within openings 102 and 104, and subsequently exposing wafer fragment 10a to chemical-mechanical polishing to remove the conductive materials from over insulative material 30a while leaving the conductive materials within openings 102 and 104. In embodiments in which conductive masses 110 and 112 comprise an inner conductively-doped-polysilicon-containing layer 114 and an outer cobalt-silicide-containing layer 116, the conductive materials can be formed by, for example, chemical vapor deposition, rapid thermal process possibly sputter deposition.

A patterned masking layer 120 is formed over insulative material 30a to define bitline constructions thereunder. Masking layer 120 can be formed of, for example, photoresist, and can be patterned by, for example, photolithographic processing. It is noted that patterned masking layer 120 is shown misaligned relative to underlying material 30a and specifically is shown overlapping conductive masses 110 and 112. The misalignment is shown to illustrate an advantage of a processing method of the present invention relative to prior art processing. In preferred embodiments, the misalignment would be avoided if possible.

FIG. 11 shows a top view of wafer fragment 10a at the processing step of FIG. 10. It is noted that although conductive masses are shown formed within all of the openings of FIG. 11 (as illustrated by having conductive mass 116 within each of openings 102, 103, 104 and 105), alternative processing could occur wherein conductive masses are formed within only some of the openings.

FIG. 12 shows wafer fragment 10a at a processing step subsequent to that of FIG. 10. A pattern is transferred from masking layer 120 to underlying materials 18a, 26a, 28a and 30a to form bitline constructions 20a, 22a and 24a. Such patterning can utilize an etch selective for insulative material 30a relative to insulative spacers 106. Alternatively, the insulative material can be etched and subsequently additional insulative material can be back-filled to replace some of the etched insulative material.

In the shown embodiment, the etch has not etched entirely through insulative material 18a. Such is shown as an exemplary embodiment of the present invention, and whether or not material 18a is etched through will depend on the composition of material 18a, as well as the duration of the etch. Accordingly, the invention encompasses embodiments wherein material 18a is entirely etched through, as well as embodiments wherein material 18a is not etched through, during the patterning of materials 26a, 28a and 30a.

The etch utilized to pattern materials 26a, 28a and 30a is preferably selective for conductive materials 26a and 28a relative to outer material 116 of conductive masses 110 and 112. Accordingly, if conductive materials 26a and 28a comprise one or more of conductively-doped polysilicon, titanium silicide, or tungsten silicide; outer conductive material 116 will preferably comprise cobalt silicide. A suitable etch for selectively etching one or more of conductively-doped polysilicon, titanium silicide and tungsten suicide relative to cobalt silicide comprises:

- an $SiO_2$, etch utilizing 600–1000 watts of power, 30–60 standard cubic centimeters per minute (sccm) $CF_4$ and 30–60 sccm $CH_2F_2$;
- a $WSi_x$ etch utilizing 200–400 watts of power, 30–60 sccm $CF_2$ and 20–40 sccm $CF_4$; and
- a polysilicon etch similar to, or identical to, the $WSi_x$ etch.

An alternative way of describing the etch utilized for patterning materials 26a, 28a and 30a is to describe material 30a as a first insulative material and conductive layers 26a and 28a as being at least one first conductive material. Insulative spacer 106 can then be referred to as a second insulative material, and conductive layer 116 can be referred to as a second conductive material. The patterning of layers 26a, 28a and 30a thus comprises an etch selective for the first insulative material relative to the second insulative material, and further comprises an etch selected for the at least one first conductive material relative to the second conductive material.

The shown misalignment of masking layer 120 causes gaps 130 and 132 to be formed between bitline constructions 22a and 24a relative to conductive masses 110 and 112, respectively.

Referring to FIG. 13, masking layer 120 (FIG. 12) is removed and an insulative material 134 is formed over bitline constructions 20a, 22a and 24a, and within gaps 130 and 132. Insulative material 134 can comprise, for example, silicon nitride, and can be formed by, for example, chemical vapor deposition.

Referring to FIG. 14, wafer fragment 10a is subjected to planarization (such as, for example, chemical-mechanical polishing) to remove insulative material 134 from over conductive masses 110 and 112, as well as from over bitline constructions 20a, 22a and 24a. Insulative material 134 remains within gaps 130 and 132 to form a protective insulative covering along portions of conductive layers 26a and 28a that had been exposed within the gaps. Accordingly, if a masking layer is misaligned as shown the processing of FIGS. 12 and 13 forms a protective insulative coating along exposed conductive bitline materials. Such protective insulative layer can insulate the bitline materials during subsequent formation of capacitor structures (described below) which can avoid device failure.

Figure 15:
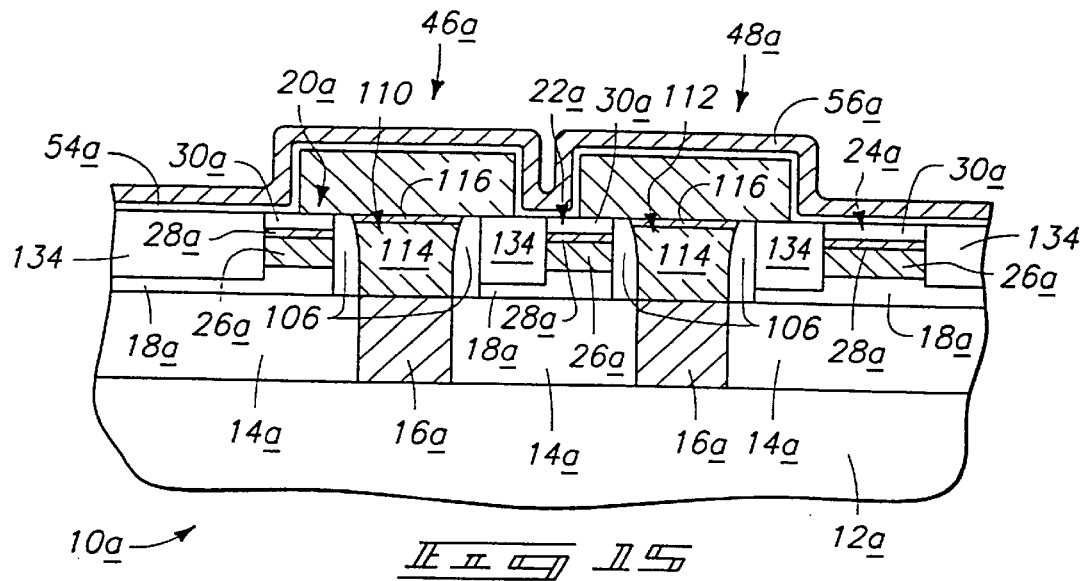
FIG. 15 is a cross-sectional view of the FIG. 7 wafer fragment shown at a processing step subsequent to that of FIG. 14, and in accordance with a first embodiment of the present invention.

Referring to FIG. 15, capacitor constructions 46a and 48a are formed over bitline constructions 20a, 22a and 24a, and are electrically connected to nodes 16a through conductive masses 110 and 112, respectively. Capacitor constructions 46a and 48a comprise storage nodes 50a and 52a, respectively, and further comprise a dielectric layer 54a and a capacitor plate layer 56a. Storage nodes 50a and 52a, dielectric layer 54a, and capacitor plate layer 56a can comprise the same materials as described in the "Background" section of this disclosure for storage nodes 50 and 52, dielectric material 54 and capacitor plate 56, respectively. It is noted that in alternative constructions (not shown) storage nodes 50a and 52a could be eliminated so that conductive masses 110 and 112 were utilized as storage nodes of the capacitor constructions. In such embodiments, dielectric material 54a would be provided on outer conductive material 116 of masses 110 and 112. Capacitor plate 56a would then be provided on dielectric material 54a so that the capacitor plate 56a was spaced from masses 110 and 112 by only dielectric material 54a.

Figure 16:
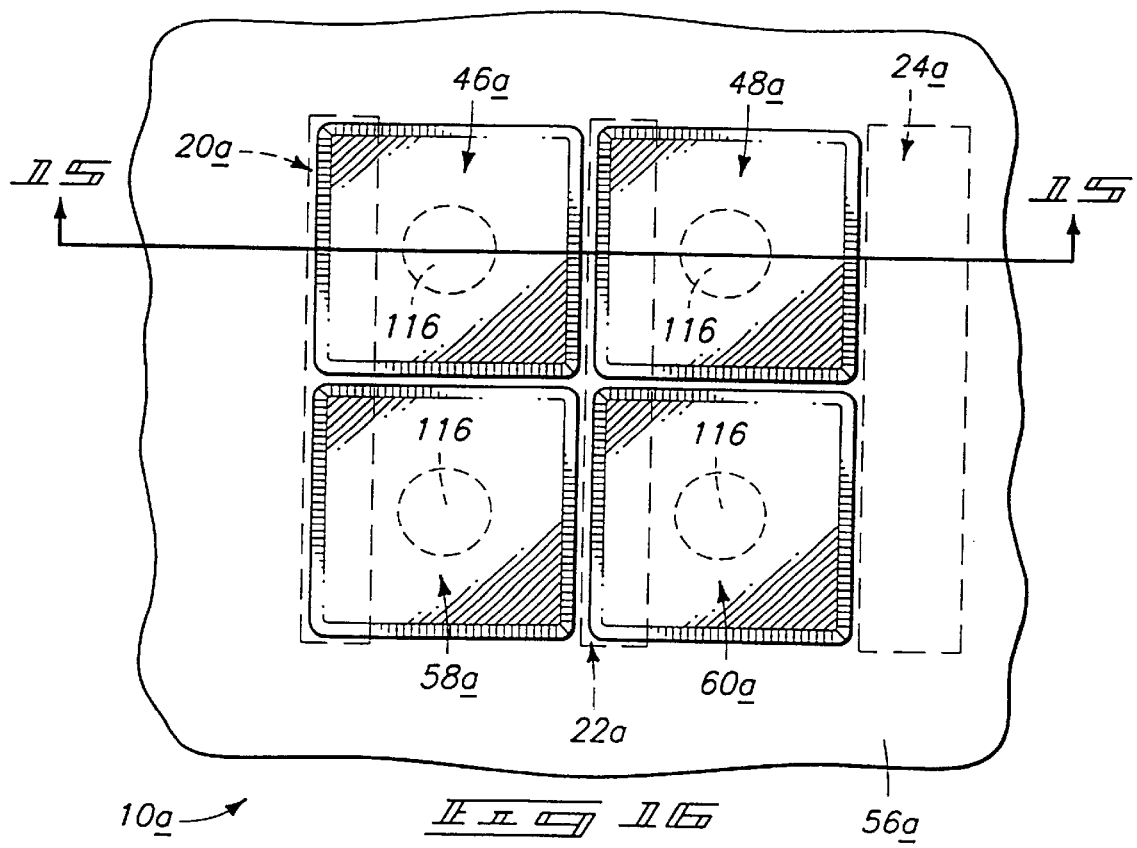
FIG. 16 is a top view of the FIG. 15 wafer fragment.

FIG. 16 shows a top view of wafer fragment 10a at the processing step of FIG. 15, and shows bitlines 20a, 22a and 24a in phantom view. FIG. 16 also shows conductive interconnect material 116 in phantom view, and shows additional capacitor constructions 58a and 60a (analogous to the constructions 58 and 60 of prior art FIG. 6) associated with wafer fragment 10a.

It is noted that none of the top view FIGS. 9, 11 or 16 pertaining to methods of the present invention show wordlines. However, it is to be understood that such wordlines would ultimately be formed, and that such could be formed before or after the processing described with reference to FIGS. 7–14. The wordlines are not shown in order to avoid cluttering the drawings of this disclosure. The fact that the wordlines are not shown in the processing of FIGS. 7–16 is not to imply anything regarding whether the wordlines exist on wafer fragment 10a during the processing of FIGS. 7–16.

FIG. 17 shows an alternate construction of wafer fragment 10a at a processing step subsequent to FIG. 14, and specifically shows different capacitor constructions than those of FIG. 15. The capacitor constructions of FIG. 17 are labeled as 160 and 162, and comprise storage nodes 164 and 166, respectively. Capacitor constructions 160 and 162 also comprise a dielectric layer 168 and a conductive cell plate layer 170. Storage nodes 164 and 166 can comprise similar materials to those described previously for storage nodes 50 and 52 of the prior art. Also, dielectric material 168 and cell plate layer 170 can comprise similar materials as dielectric material 54 and cell plate layer 56 of the prior art. A difference between capacitor constructions 160 and 162 of FIG. 17 and capacitor constructions 46a and 48a of FIG. 15 is that capacitor constructions 160 and 162 are in the form of container-shaped capacitors. FIG. 17 is provided to emphasize that any shape of capacitor construction can be utilized in methods of the present invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor construction, comprising:
   an insulative material;
   a first conductive material extending into the insulative material and comprising an upper surface of cobalt suicide;

a dielectric layer over the cobalt silicide upper surface; and a second conductive material over the dielectric layer.

2. The construction of claim 1 further comprising a third conductive material between the cobalt silicide upper surface and the dielectric material.

3. The construction of claim 1 further comprising a third conductive material between the cobalt silicide upper surface and the dielectric material; and wherein the third conductive material is in a container shape.

4. The construction of claim 1 further comprising a third conductive material between the cobalt silicide upper surface and the dielectric material; and wherein the third conductive material is in a shape of a rectangular block.

5. The construction of claim 1 wherein the cobalt suicide upper surface is part of a layer comprising cobalt suicide; and wherein the layer comprising cobalt silicide is on a layer comprising conductively-doped polysilicon.

6. A DRAM array construction, comprising:

a semiconductive material substrate;

an insulative material supported by the substrate;

first conductive material extending into the insulative material and comprising an upper surface of cobalt silicide;

a dielectric layer over the cobalt silicide upper surface; and a second conductive material over the dielectric layer;

the first conductive material, dielectric layer and second conductive material together being incorporated into at least one capacitor construction.

7. The construction of claim 6 further comprising a third conductive material between the cobalt silicide upper surface and the dielectric material.

8. The construction of claim 6 further comprising a third conductive material between the cobalt silicide upper surface and the dielectric material; and wherein the third conductive material is in a container shape.

9. The construction of claim 6 further comprising a third conductive material between the cobalt suicide upper surface and the dielectric material; and wherein the third conductive material is in a shape of a rectangular block.

10. The construction of claim 6 wherein the cobalt suicide upper surface is part of a layer comprising cobalt silicide; and wherein the layer comprising cobalt silicide is on a layer comprising conductively-doped polysilicon.

* * * * *

UNITED STATES PATENT AND TRADEMARK OFFICE
CERTIFICATE OF CORRECTION

PATENT NO.    : 6,636,415 B2
DATED         : October 21, 2003
INVENTOR(S)   : Sanh D. Tang et al.

It is certified that error appears in the above-identified patent and that said Letters Patent is hereby corrected as shown below:

<u>Column 6,</u>
Lines 39-40, replace "deposition, rapid thermal process possibly sputter deposition." with -- deposition, rapid thermal process (RTP) annealing, and/or possible sputter deposition. --

<u>Column 7,</u>
Line 20, replace "doped polysilicon, titanium silicide and tungsten suicide" with -- doped polysilicon, titanium silicide and tungsten silicide --

<u>Column 8,</u>
Line 67, replace "suicide;" with -- silicide; --

<u>Column 9,</u>
Line 15, replace "The construction of claim 1 wherein the cobalt suicide" with -- The construction of claim 1 wherein the cobalt silicide --
Line 16, replace "upper surface is part of a layer comprising cobalt suicide;" with -- upper surface is part of a layer comprising cobalt silicide; --

<u>Column 10,</u>
Line 16, replace "conductive material between the cobalt suicide upper" with -- conductive material between the cobalt silicide upper --
Line 20, replace "The construction of claim 6 wherein the cobalt suicide" with -- The construction of claim 6 wherein the cobalt silicide --

Signed and Sealed this

Thirteenth Day of April, 2004

JON W. DUDAS
*Acting Director of the United States Patent and Trademark Office*